US008995936B2

(12) United States Patent
Desclos et al.

(10) Patent No.: US 8,995,936 B2
(45) Date of Patent: Mar. 31, 2015

(54) COMMUNICATION SYSTEM WITH BAND, MODE, IMPEDANCE AND LINEARIZATION SELF-ADJUSTMENT

(71) Applicant: Ethertronics, Inc., San Diego, CA (US)

(72) Inventors: Laurent Desclos, San Diego, CA (US); Alexandre Dupuy, San Diego, CA (US)

(73) Assignee: Ethertronics, Inc., San Diego, CA (US)

( * ) Notice: Subject to any disclaimer, the term of this patent is extended or adjusted under 35 U.S.C. 154(b) by 213 days.

(21) Appl. No.: 13/675,992

(22) Filed: Nov. 13, 2012

(65) Prior Publication Data
US 2013/0137384 A1 May 30, 2013

Related U.S. Application Data

(60) Provisional application No. 61/559,615, filed on Nov. 14, 2011.

(51) Int. Cl.
| | |
|---|---|
| H04B 1/04 | (2006.01) |
| H03F 1/02 | (2006.01) |
| H03F 1/32 | (2006.01) |
| H03F 1/34 | (2006.01) |
| H03F 3/24 | (2006.01) |
| H03F 3/68 | (2006.01) |

(52) U.S. Cl.
CPC ............ *H04B 1/0475* (2013.01); *H03F 1/0222* (2013.01); *H03F 1/0294* (2013.01); *H03F 1/3223* (2013.01); *H03F 1/3247* (2013.01); *H03F 1/345* (2013.01); *H03F 3/24* (2013.01); *H03F 3/68* (2013.01); *H04B 2001/0408* (2013.01); *H04B 2001/0425* (2013.01); *H04B 2001/0441* (2013.01); *H03F 2200/57* (2013.01); *H03F 2201/3233* (2013.01)

USPC .......................................... 455/114.3; 375/296

(58) Field of Classification Search
USPC ............ 455/114.3, 115.1, 114.2, 63.1, 67.13, 455/552.1; 375/296, 295
See application file for complete search history.

(56) References Cited

U.S. PATENT DOCUMENTS

| | | | | |
|---|---|---|---|---|
| 5,712,593 | A * | 1/1998 | Buer et al. ..................... | 330/129 |
| 6,275,685 | B1 * | 8/2001 | Wessel et al. ................. | 455/126 |
| 6,900,773 | B2 | 5/2005 | Poilasne et al. | |
| 6,961,368 | B2 * | 11/2005 | Dent et al. ..................... | 375/219 |
| 7,535,298 | B2 * | 5/2009 | Sihlbom et al. ............... | 330/149 |
| 7,830,320 | B2 | 11/2010 | Shamblin et al. | |

(Continued)

OTHER PUBLICATIONS

Ding, Digital Predistortion of Power Amplifiers for Wireless Applications, School of Electrical and Computer Engineering, Georgia Institute of Technology, Mar. 2004.

(Continued)

*Primary Examiner* — Sonny Trinh
(74) *Attorney, Agent, or Firm* — Coastal Patent Law Group, P.C.

(57) ABSTRACT

A communication system is provided, including an antenna, a PA, a linearization circuit to enhance linearity, a filter system, and a controller. The controller is configured to receive information on the signals and conditions, and based on the information the controller controls one or more of the antenna, the PA, the linearization circuit and the filter system to provide an optimum configuration to meet specifications of signal properties under the conditions. The controller may look up a registry having entries regarding the specifications of signal properties under conditions in terms of predetermined parameters.

10 Claims, 18 Drawing Sheets

PA System with DPD Linearization

(56) References Cited

U.S. PATENT DOCUMENTS

| | | | |
|---|---|---|---|
| 7,860,185 B2* | 12/2010 | Utsunomiya et al. | 375/296 |
| 7,911,402 B2 | 3/2011 | Rowson et al. | |
| 8,391,809 B1* | 3/2013 | Fuller | 455/114.3 |
| 2013/0109434 A1 | 5/2013 | Dupuy et al. | |
| 2013/0122831 A1 | 5/2013 | Desclos et al. | |

OTHER PUBLICATIONS

Jeonghyeon Cha, Optimum Design of a Predistortion RF Power Amplifier for Multicarrier WCDMA Applications, IEEE Transactions on Microwave Theory and Techniques, vol. 52, No. 2, Feb. 2004.
Nagata, Linear Amplification Technique for Digital Mobile Communications, Communications Res. Lab., CELC Systems Res. Labs., NEC Corporation, Jan. 1989.
Cavers, Amplifier Linearization Using a Digital Predistorter with Fast Adaptation and Low Memory Requirements, IEEE Transactions on Vehicular Technology, vol. 39. No. 4, Nov. 1990.
Jangheon Kim, Analog Predistortion High Power Amplifier Using Novel Low Memory Matching Topology, Journal of the Korea Electromagnetic Engineering Society, vol. 7, No. 4, Dec. 2007.
Stapleton, S., Adaptive FeedForward Linearization for RF Power Amplifiers, Seminar: Gain Without Pain Nov. 2000.
Stapleton, S., RF Predistortion of Power Amplifiers, Seminar: Gain Without Pain Nov. 2000.
Stapleton, S., Adaptive FeedForward Linearization for RF Power Amplifiers—Part 2, Seminar: Gain Without Pain Mar. 27, 2008.
Volakis, J.L., Phase Linearization of a Broad-Band Antenna Response in Time Domain, IEEE Transactions on Antennas and Propagation, vol. AP-30, No. 2 , Mar. 1982.
Kanellakopoulos, Systematic Design of Adaptive Controllers for Feedback Linearizable Systems 1, IEEE Transactions on Automatic Control, vol. 36, No. 11, Nov. 1991.
Asbeck, P., Design Options for High Efficiency Linear Handset Power Amplifiers, Silicon Monolithic Integrated Circuits in RF Systems, 2009.
Boumaiza, Digital Predistortion Challenges in the Context of Software Defined Transmitters, General Assembly and Scientific Symposium, Aug. 2011 XXXth URSI.
Hai-Shueh Lee, A high linearity and wide band feedforward amplifier design, Microwave Conference, Sep. 1995. 25th European (vol. 2 ).
Bin Cheng, A Predistortion Linearizer for Ka-band Power Amplifier in Integrated Fin-line Technique, Microwave Conference Proceedings (CJMW), 2011 China-Japan Joint.
Homayounfar, Digital Predistortion without Lookup Tables, The Institute of Electronics, Information and Communication Engineers, IEICE technical report. Signal processing 108(390), 13-17, Jan. 15, 2009.
Grant, S. J., A DSP Controlled Adaptive Feedforward Amplifier Linearizer, Simon Fraser University, Jul. 1996.
Nezami, Fundamentals of Power Amplifier Linearization Using Digital Pre-Distortion, High Frequency Electronics, Sep. 2004.
Raab, F., RF and Microwave Power Amplifier and Transmitter Technologies—Part 4, High Frequency Electronics, Nov. 2003.
Intersil, Pre-Distortion Linearizer, ISL5239, Sep. 2, 2005.
Katz, Passive FET MMIC Linearizers for C, X and KU-Band Satillite Applications, Microwave and Millimeter-Wave Monolithic Circuits Symposium, 1993. Digest of Papers., IEEE 1993.
Kumar, Predistortion Linearize Using GaAs Dual-Gate MESFET for TWTA and SSPA Used in Satellite Transponders, IEEE Transactions on Microwave Theory and Techniques, vol. MTT-33, No. 12, Dec. 1985.
Mekechuk, Linearizing Power Amplifiers Using Digital Predistortion, EDA Tools and Test Hardware, High Frequency Electronics, Apr. 2004.
Sappal, Digital Pre-distortion of Power Amplifiers using look-Up Table Method with Memory Effects, ICGST-PDCS, vol. 8, Issue 1, Dec. 2008.
Jeong, Envelope Tracking Power Amplifiers with Reduced Peak-to-Average Power Ratio RF Input Signals, Radio and Wireless Symposium (RWS), 2010 IEEE.
Brunmayer, Implementation of a Nonlinear Digital Pre-distortion Algorithm, Jul. 2005.
Hao Li, A Fast Digital Predistortion Algorithm for Radio-Frequency Power Amplifier Linearization With Loop Delay Compensation, IEEE Journal of Selected Topics in Signal Processing, vol. 3, No. 3, Jun. 2009.
Patel, "Adaptive digital predistortion linearizer for power amplifiers in military UHF satellite" (2004). Theses and Dissertations. Paper 1192.
Suzuki, Wideband and High Efficiency Feed-Forward Linear Power Amplifier for Base Stations, NTT DOCOMO Technical Journal vol. 11 No. 1.
Meyer, A Wide-Band Feedforward Amplifier, IEEE Journal of Solid-Statecircuits,vol. SC-9,No. 6, Dec. 1974.
Yamauchi, A Novel Series Diode Linearizer for Mobile Radio Power Amplifiers, Microwave Symposium Digest, 1996., IEEE MTT-S International (vol. 2 ).

* cited by examiner

FIG. 1 PA Operation at Back-Off

FIG. 2 Predistortion Concept

FIG. 3: Analog Predistortion technique

FIG. 4: Digital Predistortion technique

FIG. 5: Feedforward Linearization Technique

FIG. 6: Envelope Feedfback Linearization Technique

FIG. 7: Polar Feedfback Linearization Technique

FIG. 8: Cartesian Feedfback Linearization Technique

FIG.9: LINC Technique

FIG.10: EER Technique

FIG.11: ET Technique

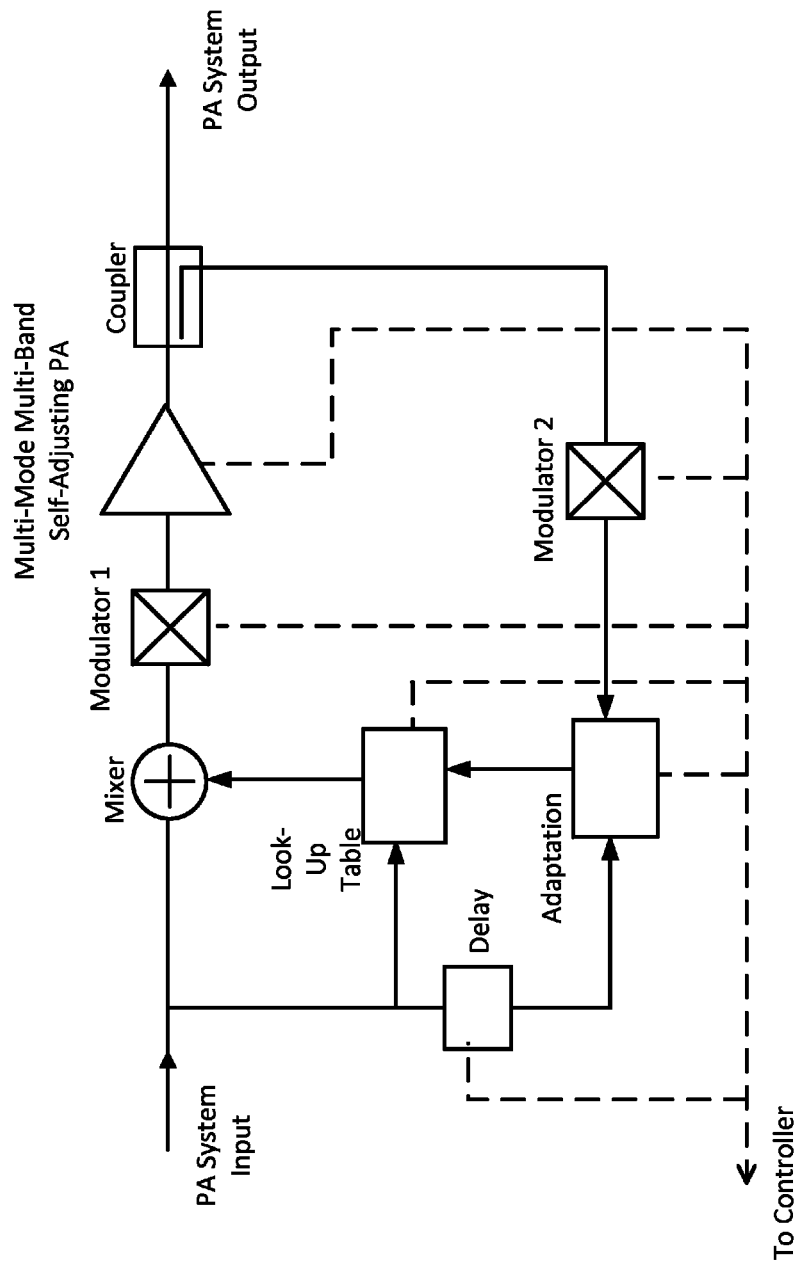
FIG.13: PA System with DPD Linearization

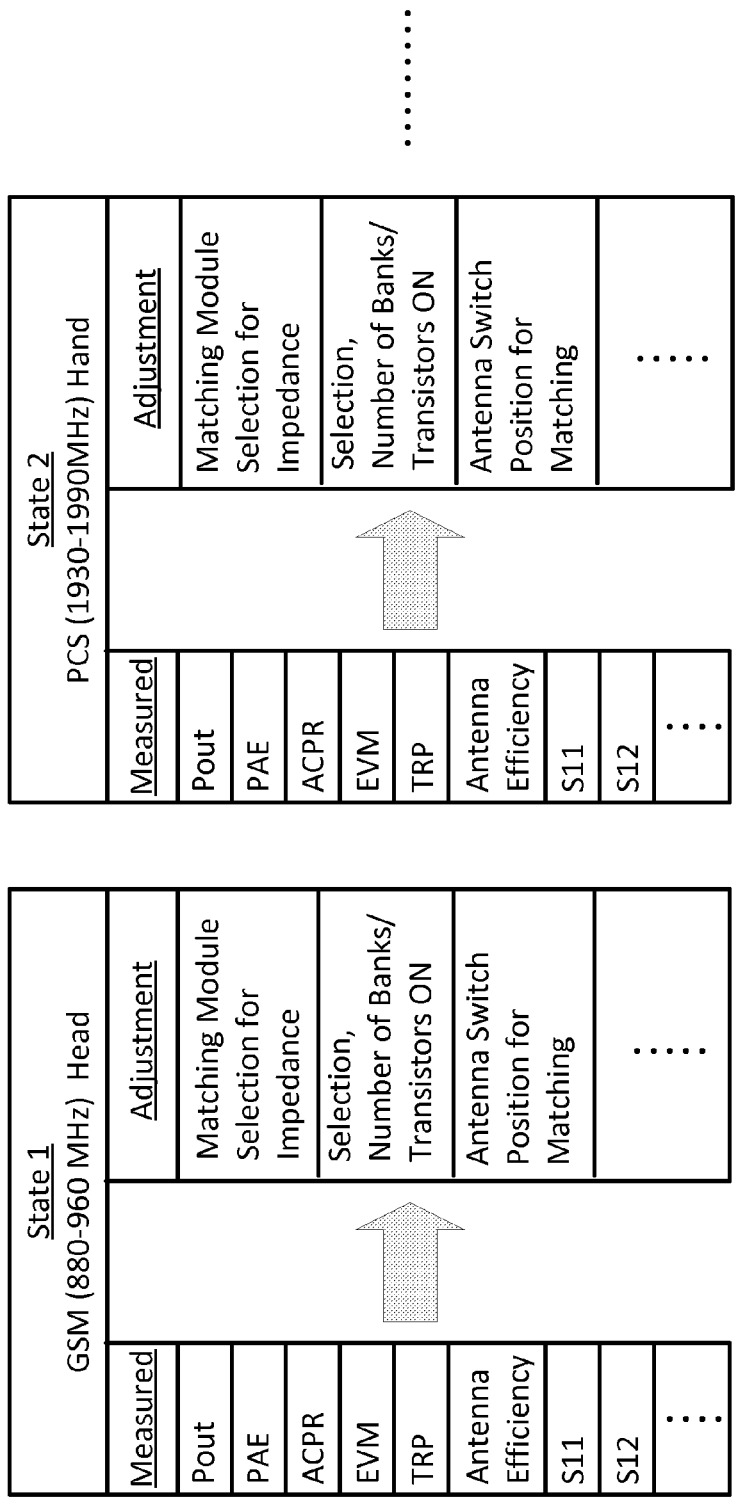
FIG.13B: Registry

COMMUNICATION SYSTEM WITH BAND, MODE, IMPEDANCE AND LINEARIZATION SELF-ADJUSTMENT

CROSS-REFERENCE TO RELATED APPLICATIONS

This application claims benefit of priority with U.S. Provisional Ser. No. 61/559,615, filed Nov. 14, 2011, titled "COMMUNICATION SYSTEM WITH BAND, MODE, IMPEDANCE AND LINEARIZATION SELF-ADJUSTMENT"; the contents of which are hereby incorporated by reference.

BACKGROUND

Frequency bands and modes associated with various protocols are specified per industry standards for cell phone and mobile device applications, WiFi applications, WiMax applications and other wireless communication applications, and the number of specified bands and modes is increasing as the demand pushes. Examples of the frequency bands and modes for cell phone and mobile device applications are: the cellular band (824-960 MHz) which includes two bands, CDMA (824-894 MHz) and GSM (880-960 MHz) bands; and the PCS/DCS band (1710-2170 MHz) which includes three bands, DCS (1710-1880 MHz), PCS (1850-1990 MHz) and AWS/WCDMA (1920-2170 MHz) bands. Examples for uplink for transmit (Tx) signals include the frequency ranges of DCS (1710-1785 MHz) and PCS (1850-1910 MHz). Examples for downlink for receive (Rx) signals include the frequency ranges of DCS (1805-1880 MHz) and PCS (1930-1990 MHz). Examples of frequency bands for WiFi applications include two bands: one ranging from 2.4 to 2.48 GHz, and the other ranging from 5.15 GHz to 5.835 GHz. The frequency bands for WiMax applications involve three bands: 2.3-2.4 GHz, 2.5-2.7 GHZ, and 3.5-3.8 GHz. Use of frequency bands and modes is regulated worldwide and varies from country to country. For example, for uplink, Japan uses CDMA (915-925 MHz) and South Korea uses CDMA (1750-1780 MHz). In this document, "modes" refer to WiFi, WiMax, LTE, WCDMA, CDMA, CDMA2000, GSM, DCS, PCS and so on; and "bands" or "frequency bands" refer to frequency ranges (700-900 MHz), (1.7-2 GHz), (2.4-2.6 GHz), (4.8-5 GHz), and so on. Laptops, tablets, personal digital assistants, cellular phones, smart phones and other mobile devices include a communication system which is generally designed to have paths or chains to process signals in multiple modes and bands.

As new generations of wireless communication devices become smaller and packed with more multi-mode multi-band functions, designing new types of antennas and associated air interface circuits is becoming increasingly important. In particular, RF (radio frequency) circuits in a handset are desired to operate with high efficiency, versatile capability with various protocol management, and resilience to external perturbations and interferences.

BRIEF DESCRIPTION OF THE DRAWINGS

FIG. 13 illustrates an example of the PA system according to an embodiment using the DPD linearization technique.

FIG. 13B illustrates an example of the registry entries.

DETAILED DESCRIPTION

Figure 1:
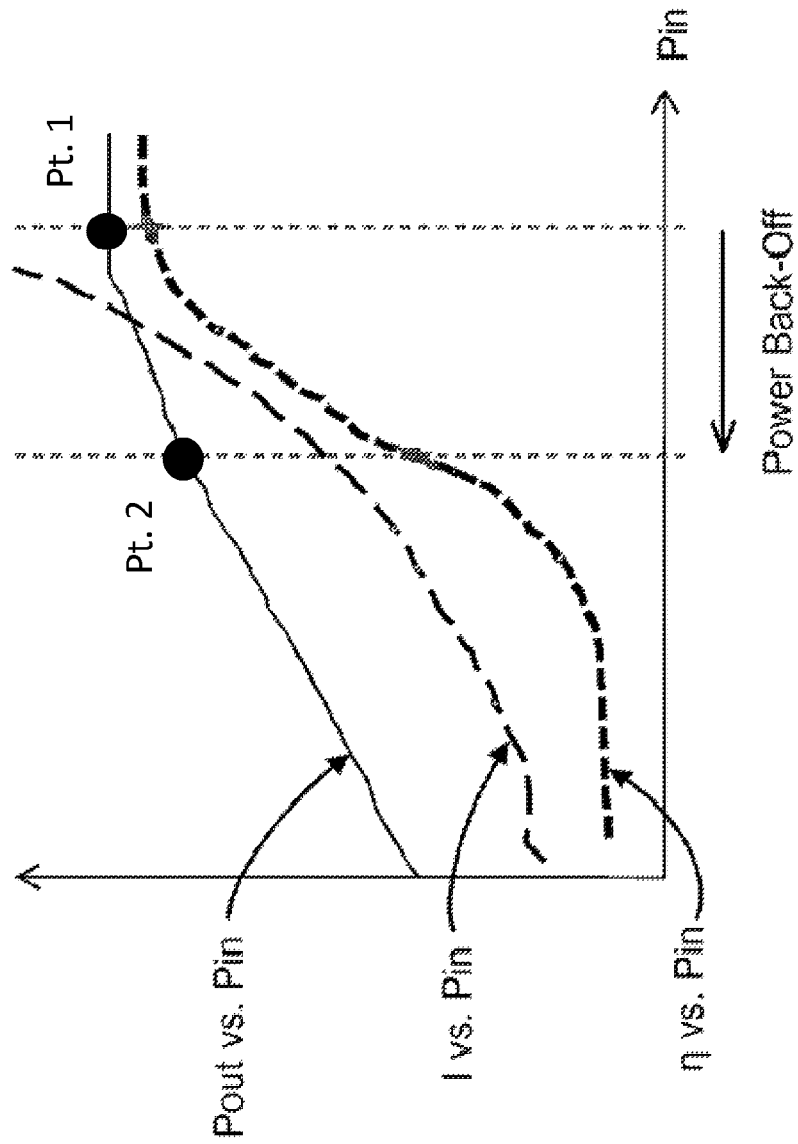
FIG. 1 illustrates an example of plots showing the output power (Pout), the output current (I) and the efficiency (η) as a function of the input power (Pin) of a typical PA.

As communication systems need to support worldwide protocols with different bands and different modes, conventional single-mode, single-band power amplifier (PA) architectures may pose rigidity with little reconfiguration possibility and yet occupy a large circuit estate. Furthermore, a communication system with an air interface tends to be affected by changes in conditions such as the presence of a human hand, a head, a metal object and other interference-causing objects placed in the vicinity of an antenna. In such cases, for example, a change in impedance may detune the antenna that can affect the system load; the frequency band may be shifted due to the detuning. A conventional system with passive antennas generally is not capable of readjusting its functionality to recover optimum performances. A tunable antenna can be used to alleviate the perturbed properties by controlling the beam, frequency response, impedance and other antenna characteristics so as to recover the original optimum performances. See, for example, U.S. Pat. Nos. 6,900,773, 7,830,320 and 7,911,402, which describe examples of active tunable antennas. Another way to recover the optimum performances may involve readjusting components and modules in the communication system based on the detuning information from the antenna through, for example, a bidirectional control line. Both the tunable antenna and the adjustable components and modules may be used for increasing flexibility.

The commonly-owned U.S. patent application Ser. No. 13/557,173, entitled "MULTI-MODE MULTI-BAND SELF-REALIGNING POWER AMPLIFIER," filed on Jul. 24, 2012, describes implementations of a PA architecture for multi-mode and multi-band operations to replace a conventional PA architecture for single-band, single-mode operations, and at the same time to dynamically adjust the frequency band, bandwidth, impedance and other properties for optimum performances. The contents of the above application are incorporated herein by reference. These PA features can be achieved by incorporating banks of transistors with different sizes in combination with adjustable matching modules, and dynamically changing the banks and the matching modules based on the time-varying information about the signals and conditions that are continually perturbed. Specifically, such a PA architecture is designed for multi-mode multi-band operations by including one or more amplifying modules, each amplifying module including one or more banks, each bank including one or more transistors; and multiple matching modules, each matching module being configured to be adjusted to provide impedances corresponding to frequency bands and conditions. A controller dynamically controls an input terminal of each bank and adjusts the matching modules to provide an optimum configuration in the PA to meet specifications on signal properties during each time interval.

Power amplifiers (PAs) are used to amplify power of radio frequency (RF) signals and are widely used in various RF circuits and devices. In modern communication systems, it is generally preferred that PAs provide high linearity and high efficiency in order to achieve a certain performance level. High efficiency is important for power loss reduction, for example, to prolong the battery lifetime of handsets. The curve showing output power versus input power indicates linearity. High linearity is important to maintain the integrity of the signal with minimal distortion; non-linearity is mainly caused by intermodulation distortion (IMD) that produces harmonics nearby the primary carrier frequency.

FIG. 1 illustrates an example of plots showing the output power (Pout), the output current (I) and the efficiency ($\eta$) as a function of the input power (Pin) of a typical PA. In this example, Pout and Pin are in the average sense when non-constant modulated signals are used. As shown in FIG. 1, high linearity and high efficiency do not occur simultaneously. The trade-off between efficiency and linearity is primarily determined by its gate (or base) overdrive in the transistor operation. To meet linearity requirements, the operating point of the PA is backed-off from its maximum level Pt. 1 close to the saturation point to the point Pt. 2, which is a point where the highest possible Pout can be achieved while still keeping the linear relationship between Pout and Pin. The efficiency and the output current decrease as the operating point of the PA is changed from Pt. 1 to the power back-off point of Pt. 2.

Specifications on PA performances are defined for individual modes and bands per industry standards. These specifications involve properties associated with output signals, such as output power, power added efficiency (PAE), error vector magnitude (EVM), adjacent channel leakage ratio (ACLR), cubic metric, Crest factor and other performance parameters. PAE is defined as the ratio of the difference between output power and input power to the DC power consumed. Linearity may also be evaluated by EVM, which is a measure of how far the points are from the ideal lattice points, expressed as a percentage. Generally, an EVM diagram illustrates that the fixed lattice points correspond to non-distortion of the signal forms and the distortions are quantized by the deviations from the lattice points. Thus, as linearity improves, the EVM value decreases. The EVM value of 0% corresponds to non-distortion, that is, the output signal from the PA has a perfect copy of the input signal, thereby giving rise to ideal linearity. The linearity specification in terms of EVM is 3% for LTE and WiFi, for example.

ACLR is another performance measure for linearity and is specified for CDMA, WCDMA, LTE and WiMAX. It is defined as the ratio of the integrated signal power in the adjacent channel to the integrated signal power in the main channel. ACLR is also referred to as adjacent channel power ratio (ACPR). Transistors are used for the power amplification purposes and may be integrated on a chip. These transistor may be a Metal Semiconductor Field Effect Transistor (MESFET), a Pseudomorphic High Electron Mobility Transistor (pHEMT), a Heterojunction Bipolar Transistor (HBT) or of other suitable technologies.

A number of linearization techniques have been developed thus far to allow for PA operations with high efficiencies with less back-off. Each technique is briefly summarized below.

Pre-Distortion (PD) Technique

Figure 2:
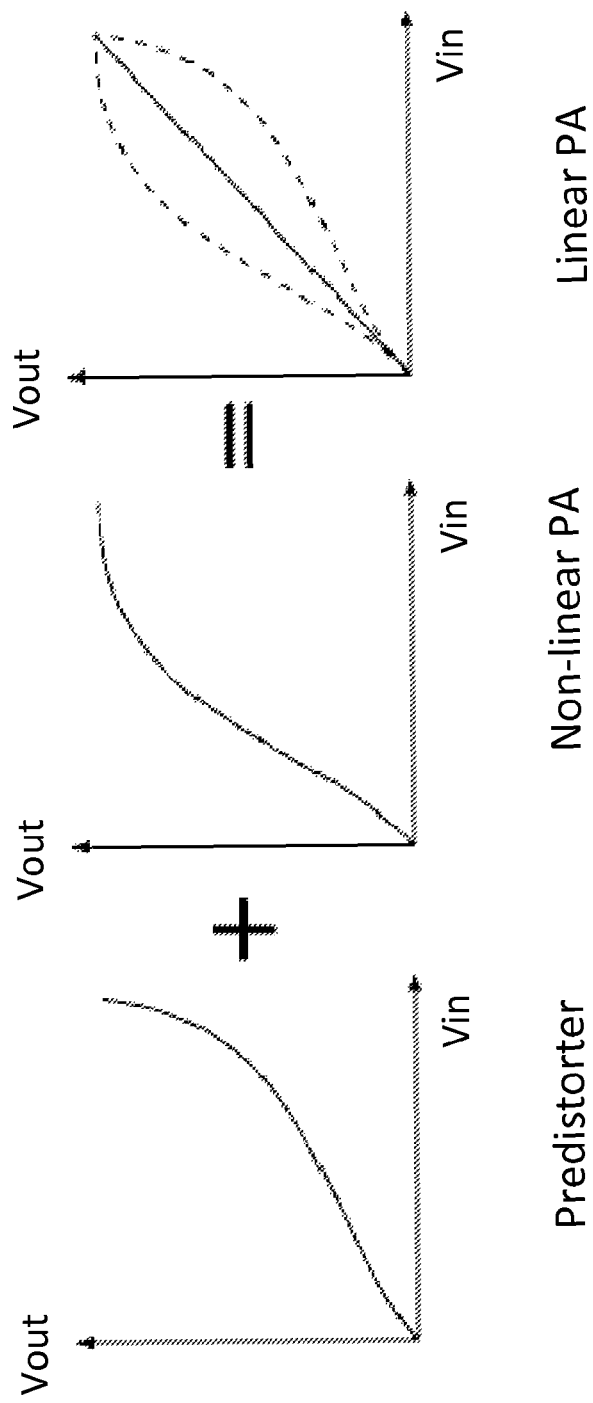
FIG. 2 illustrates a basic concept of pre-distortion technique.

FIG. 2 illustrates a basic concept of pre-distortion technique, where schematic plots of the output voltage Vout versus the input voltage Vin of a predistorter, a non-linear PA and a resultant linear PA are shown separately. The predistorter has the inverse of the non-linear characteristics of the non-linear PA; thus, the combined characteristics of both provide the linear characteristics. For example, the predistorter may be configured to generate IMD that is in anti-phase with the IMD produced by the non-linear PA. The insertion of such a predistorter between the input and the non-linear PA can therefore reduce IMD signals.

1. Analog Pre-Distortion

Figure 3:
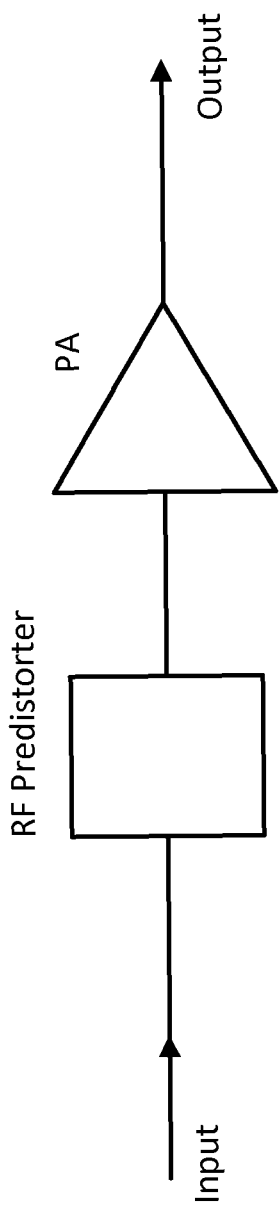
FIG. 3 illustrates an example of a system adapted for analog pre-distortion technique.

FIG. 3 illustrates an example of a system adapted for analog pre-distortion technique. An analog predistorter is inserted between the input and the PA. An example of the analog predistorter includes a cubic predistorter that reduces the third order IMD, which is most important among various order IMDs. The third order IMD results from the second-order IMD of one signal mixing with the first order IMD of another signal. Even order IMDs are normally out of band, and thus easily filtered out. However, the third order IMD is closer to the primary signal frequency and larger in magnitude than the higher order IMDs. Since the analog predistorter is inserted before the PA, the insertion loss is minimized. In addition, the analog predistorter is capable of linearize over a wide bandwidth. However, PAs generally have memory effects due to wide bandwidth characteristics of the system, where the memory effects are defined as changes of the amplitude and phase in IMDs due to the previous signals. Therefore, the memory effects of the PA need to be minimized so as to have a good harmonic cancellation behavior using the analog predistorter. Examples of analog predistorter implementations include a series diode with a parallel capacitor, where the non-linearity of a series resistance of the diode is utilized to counteract the non-linearity of the PA.

2. Digital Pre-Distortion (DPD)

Figure 4:
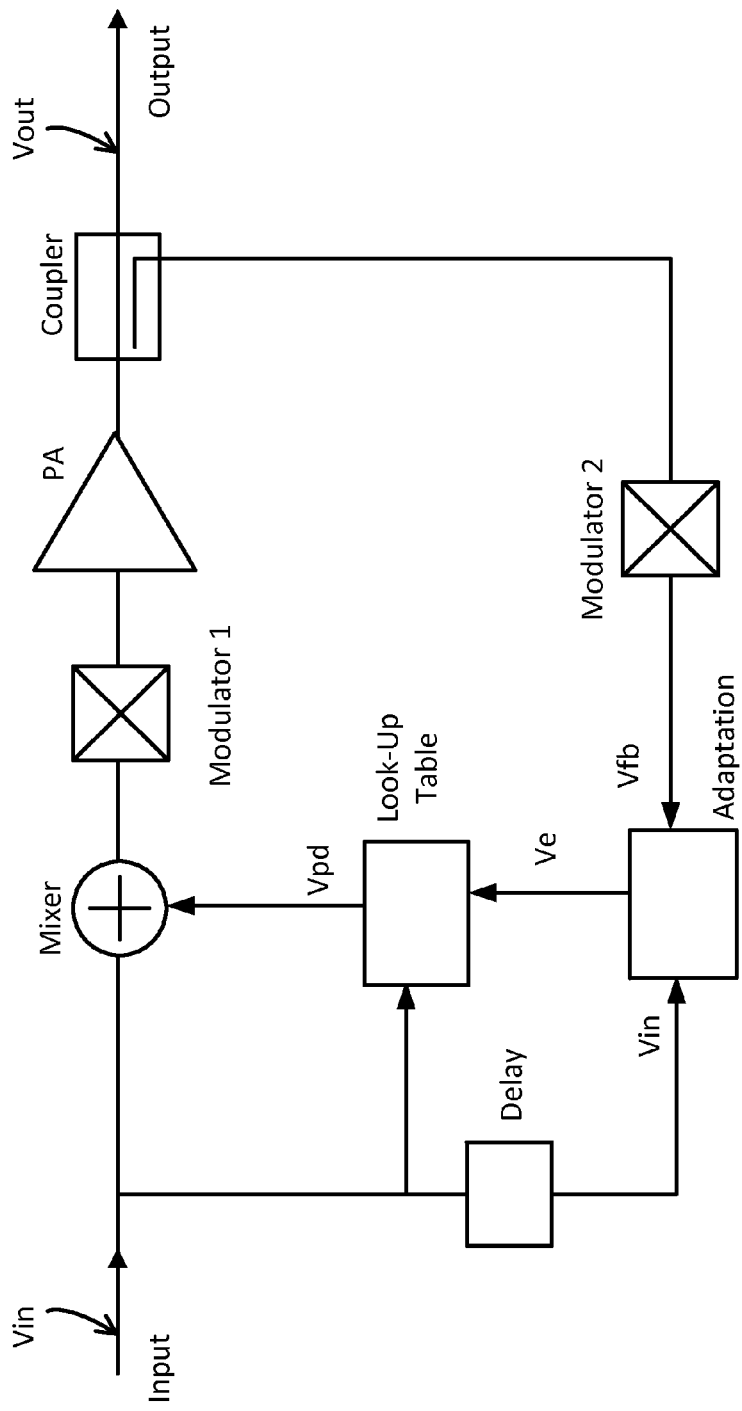
FIG. 4 illustrates an example of a system adapted for digital pre-distortion (DPD) technique.

Digital pre-distortion techniques involve digital processing available from, for example, digital signal processing (DSP) devices, to form and update the pre-distortion characteristics. FIG. 4 illustrates an example of a system adapted for DPD technique. The digital pre-distortion parameters are stored in a look-up table that can be updated with adaptive feedback. Specifically, in this figure, the input signal is represented by a complex voltage Vin, and various combinations of Vin signal forms are mapped to pre-distortion signal forms Vpd, which are stored in the look-up table. The input signal Vin and the pre-distortion signal Vpd are summed at a mixer to provide the inverse of the non-linear characteristics of the PA, thereby canceling the distortion at the PA output. A modulator 1 may be included at the input side of the PA for signal modulation functions such as digital-to-analog conversion, up-conversion and others. The entries in the look-up table need updating for proper distortion cancellation. The output signal Vout from the PA is sensed by a coupler, for example, and used as the feedback signal Vfb. A modulator 2 may be included to demodulate and analog-to-digital convert the feedback signal Vfb prior to an adaptation block. The delayed version of the input signal Vin is generated by a delay block. The delayed version is inputted to the adaptation block as a reference signal and compared with the Vfb to generate the error signal Ve. The error signal Ve is used to iteratively update the lookup table to reduce the error.

Similar to the analog pre-distortion technique, the insertion loss can be minimized and the IMD reduction can be achieved over a wide bandwidth in the DPD technique. The DPD scheme can be adapted for the use of I and Q (quadrature) components of the input and feedback signals to provide amplitude and phase corrections. Two common types of digital predistorters are termed mapping predistorters and complex-gain predistorters. The mapping predistorter utilizes two look-up tables, each of which is a function of two variables (I and Q). Thus, the storage and/or data processing for the look-up tables become complex in this technique, and the adaptation algorithm tends to have a low speed of convergence. On the other hand, the complex-gain predistorter utilizes a single look-up table indexed by the signal envelop, i.e., square root of $I^2+Q^2$. Thus, this technique reduces the complexity and adaptation time compared to the mapping pre-distortion technique, while using the look-up table to force the predistorter and the PA to exhibit a constant gain and phase at various envelope levels considered.

Feedforward Linearization Technique

Figure 5:
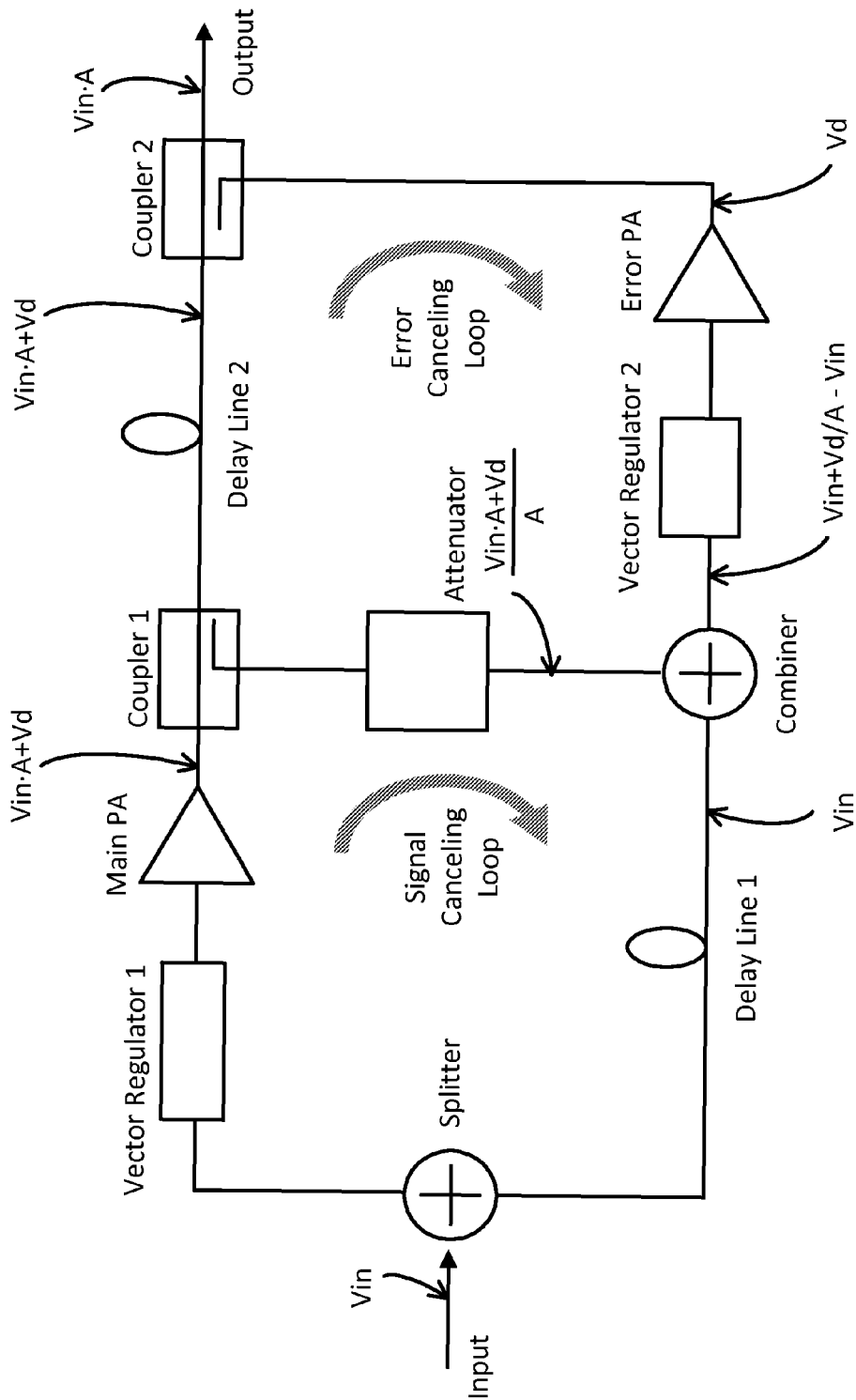
FIG. 5 illustrates an example of a system adapted for feed forward linearization technique.

FIG. 5 illustrates an example of a system adapted for feedforward linearization technique. The input power is inputted from the input, and the output power, which is the amplified input power, is outputted from the output. Signal forms at various nodes are represented by corresponding voltages in this figure. The feedforward technique involves two loops in the system: signal canceling loop and error canceling loop. In the signal canceling loop, the input voltage Vin is split into two paths. The first path includes a vector regulator 1, which may comprise a variable attenuator and a variable phase shifter, and is coupled to a main PA. The main PA amplifies the input voltage by a factor of A and generates distortion signals represented by Vd, thereby producing Vin·A+Vd at its output. The output voltage from the main PA, Vin·A+Vd, is then sensed by a coupler 1 and sent to an attenuator, which attenuates the voltage by a factor of A, thereby producing Vin+Vd/A at its output. In the second path, the input voltage Vin transmits through a delay line 1. The two voltages, Vin+Vd/A and −Vin, are combined by a combiner, and the resultant voltage Vd/A is sent to the error canceling loop. The voltage Vd/A transmits through a vector regulator 2, which may comprise a variable attenuator and a variable phase shifter, and is inputted to an error PA. The error PA is configured also to have an amplification factor of A, thereby producing the distortion portion of the voltage Vd at its output. In the other path of the error canceling loop, the output voltage from the main PA, Vin·A+Vd transmits through a delay line 2 and reaches a coupler 2, where Vd is subtracted from the Vin·A+Vd; thus, the output receives the amplified output voltage Vin·A.

The delay lines are included in the system to ensure operation over a wide bandwidth. In particular, the delay line 2 in the error canceling loop is configured to compensate for the group delay of the main PA. The variable attenuator in the system is used to adjust the output level to the input reference. The variable phase shifter is used to adjust the PA output in an anti-phase arrangement to the input reference. In the feedforward technique, the bandwidth is mainly determined by frequency response of the couplers, delay lines and phase shift components, which can be made stable over a wide operating range. The outputs of the main and error PA are combined in a coupler that isolates the PAs from each other and provides resistive input impedance. For a typical 10 dB coupling ratio, 90% of the power from the main PA reaches the output, whereas only 10% of the power from the error amplifier reaches the load. Therefore, the error PA needs to produce ten times the power of the distortion in the main PA. The amplification of the error signal is inherently less efficient than that of the main signal. As a result, the power consumes by the error PA can be a significant fraction (e.g., ⅓) of that of the main PA. In addition, it may be necessary to operate one or both PAs well into back-off to improve linearity.

Feedback Linearization Technique.

1. Envelope Feedback

Figure 6:
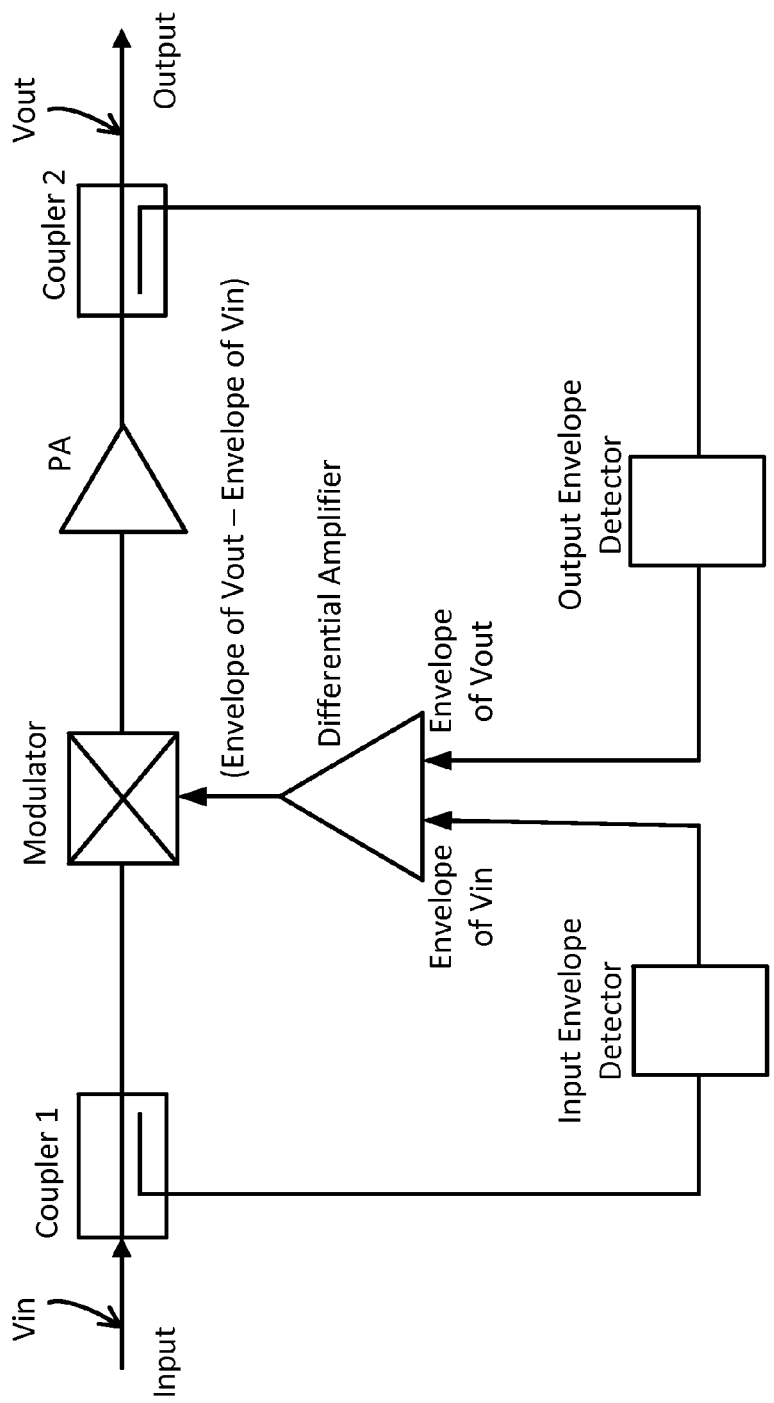
FIG. 6 illustrates an example of a system adapted for envelope feedback linearization technique.

FIG. 6 illustrates an example of a system adapted for envelope feedback linearization technique. The input power is inputted from the input, and the output power, which is the amplified input power, is outputted from the output. The input signal with the input voltage Vin is sampled by a coupler 1, and the envelope of the input signal is detected by an input envelop detector. The resulting input envelop is fed to one input of a differential amplifier. The output signal with the output voltage Vout is sampled by a coupler 2, and the envelope of the output signal is detected by an output envelop detector. The resulting output envelop is fed to the other input of the differential amplifier. The envelope detector may include a diode in series that rectifies the incoming signal, allowing for detection of positive current flow. The difference signal, i.e., envelope of Vout—envelope of Vin, is outputted from the differential amplifier and is used to drive a modulator in the main path. The modulator modifies the envelope of the input signal that drives the PA. The envelope of the resulting output signal form the PA is therefore linearized to a degree determined by the loop gain of the feedback process.

In the envelope feedback technique, the achievable linearity improvement depends on the relative levels of the AM-AM and AM-PM conversions in the PA. Since AM-PM distortion is not corrected by the envelope feedback, linearity improvement may not be observed if phase distortion is the dominant form of non-linearity. This is often the case in, for example, class-C and LDMOS PAs. The use of the envelope feedback technique is therefore generally limited to relatively linear class-A or -AB PAs.

2. Polar Feedback

Figure 7:
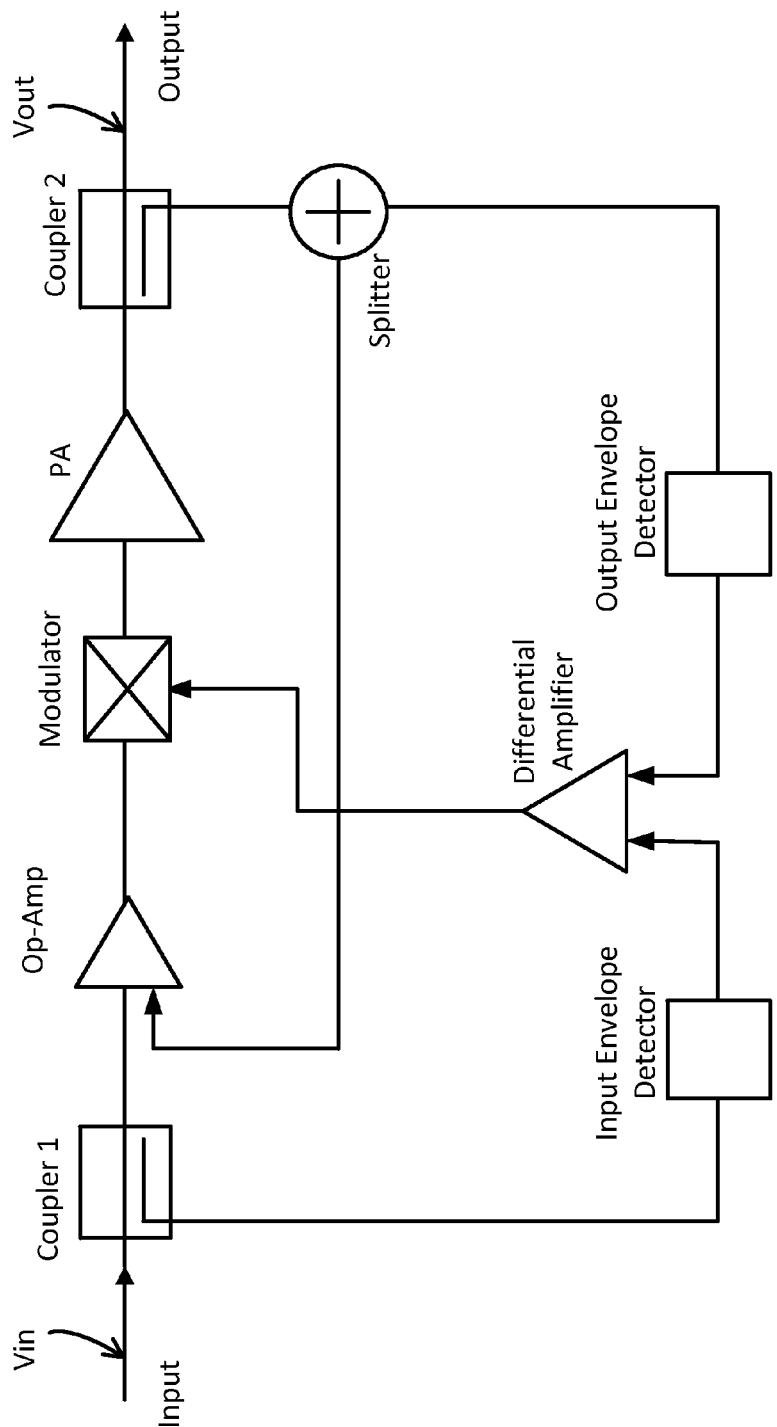
FIG. 7 illustrates an example of a system adapted for polar feedback linearization technique.

FIG. 7 illustrates an example of a system adapted for polar feedback linearization technique. The polar feedback technique essentially combines the envelope feedback with a phase feedback loop, which is an additional feedback loop to account for phase variations through the PA by dynamically adjusting the phase of the input signal. The envelop- and phase-feedback functions operate essentially independently. In FIG. 7, in addition to the envelope feedback loop as illustrated in FIG. 6, the phase feedback loop is coupled to a splitter that splits the output signal, which is represented by Vout and sensed by a coupler 2, into envelop and phase variations. The phase variation information of Vout is then sent to one input of an op-amp. The phase reference of the input signal represented by Vin is sent through a coupler 1 to the other input of the op-amp. The output phase variation information with respect to the input reference is used for phase correction in the op-amp and a modulator to dynamically adjust the input phase for the PA.

In the polar feedback linearization technique, different bandwidths need to be considered for the envelope and phase feedback paths. For example, the phase bandwidth can be 5-10 times the envelope bandwidth, which limits available loop gain for a given delay. Thus, different levels of improvement may result in the AM-AM and AM-PM characteristics.

3. Cartesian Feedback

Figure 8:
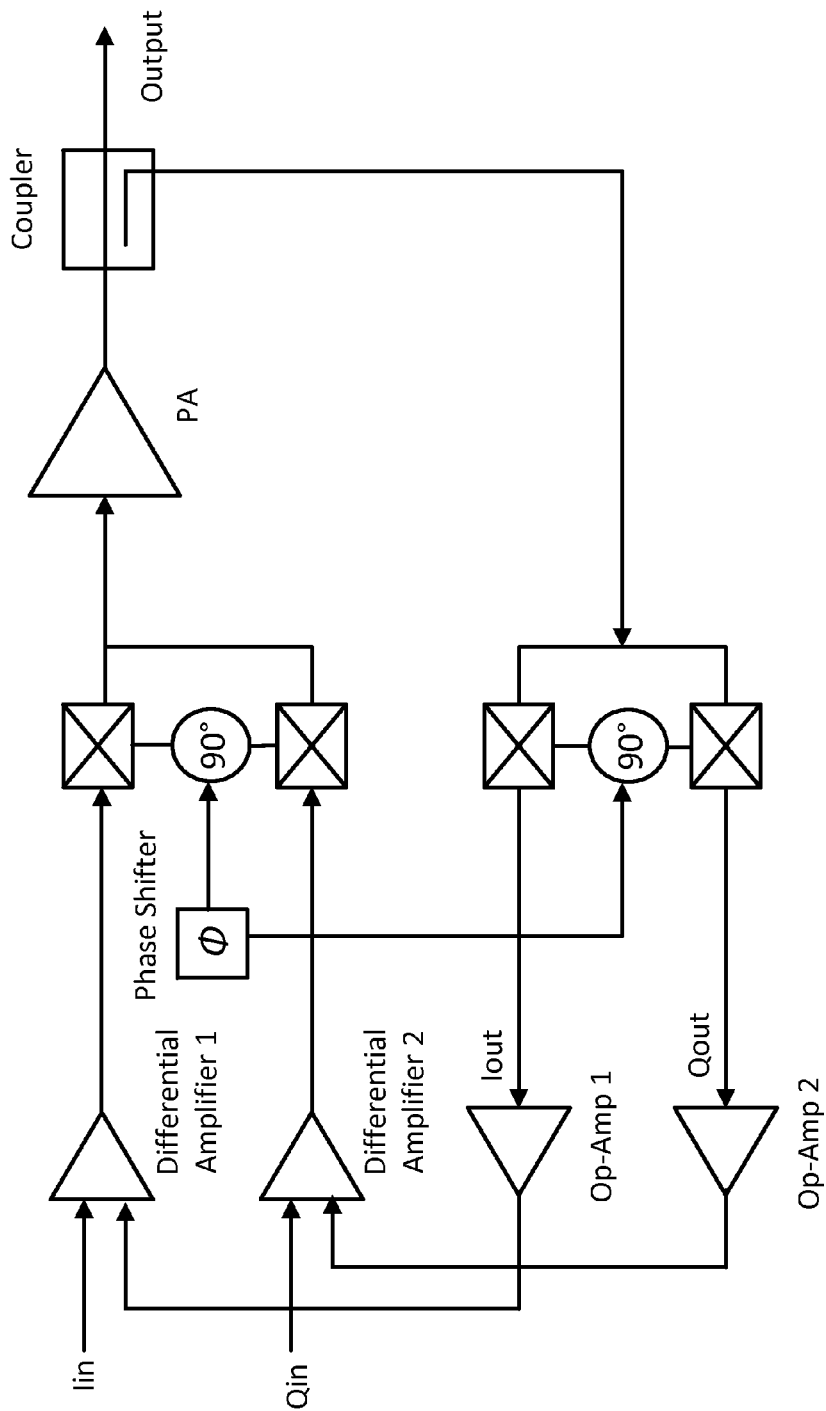
FIG. 8 illustrates an example of a system adapted for Cartesian feedback linearization technique.

FIG. 8 illustrates an example of a system adapted for Cartesian feedback linearization technique. The Cartesian feedback is similar to the polar feedback; however, the signal is processed in I and Q (quadrature) components. The input signal is split into Iin and Qin components in a baseband, for example, and fed to differential amplifiers 1 and 2, respectively. The output signal is also split into Iout and Qout components and fed to op-amps 1 and 2, respectively. The difference in signal between the input and output is obtained in each of the differential amplifiers. The difference signals for the I and Q components are up-converted, combined and inputted to the PA for amplification. A phase shifter is added to ensure that up and down conversion processes are synchronized.

In the Cartesian feedback, the problem associated with the wide bandwidth of the signal phase is alleviated by using modulation feedback in I and Q components. As a result, ACLR can be improved by as much as 40 dB in certain cases. Additionally, the phase differences between the AM-AM and AM-PM modulations can be reduced compared to the polar feedback.

Linear Amplification Using Non-Linear Components (LINC)

Figure 9:
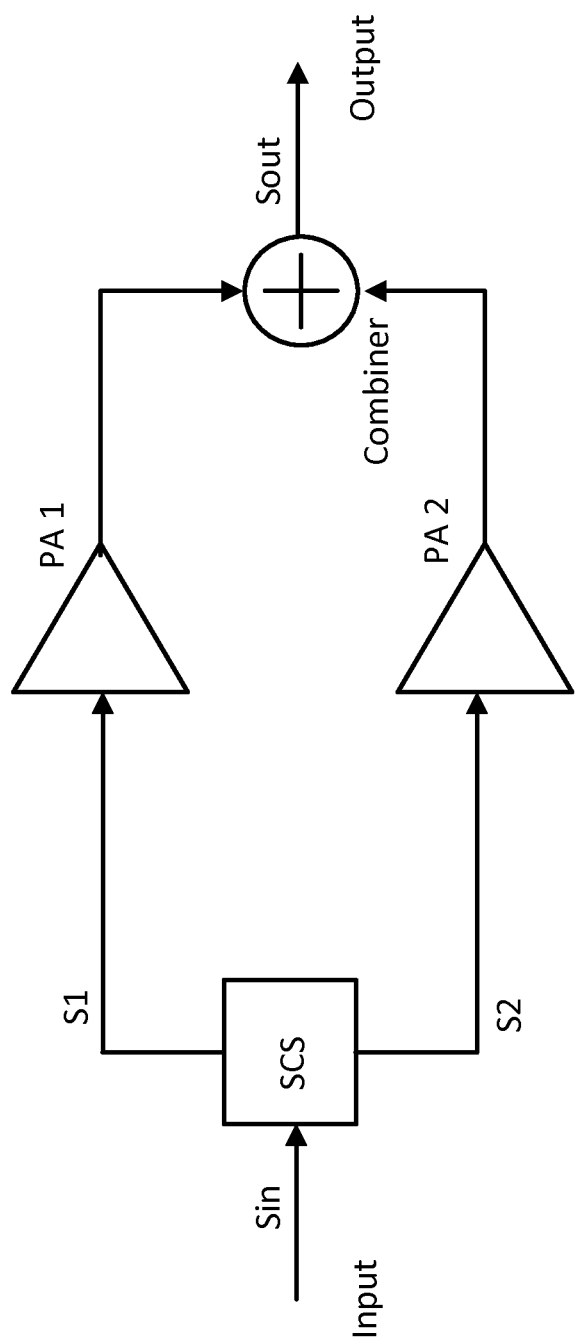
FIG. 9 illustrates an example of a system adapted for Linear Amplification Using Non-linear Components (LINC) technique.

FIG. 9 illustrates an example of a system adapted for LINC technique. In the LINC technique, the input signal Sin is converted by a signal component separator (SCS) into two constant envelope signals S1 and S2. This technique uses two PAs that can be highly non-linear but with high efficiency, such as class-D, -E, -F or -J PA. The constant envelope signals S1 and S2 are inputted to PA 1 and PA 2, respectively, and the amplified signals are summed at a combiner to produce the output signal S out.

In the LINC technique, complex signal forms are generated so that undesired out-of-band components can be in anti-phase in the two PA paths and cancel each other at the summing, while wanted components can be in phase and reinforced at the summing. Thus, the linearity performance of the technique primarily depends on the gain and phase matching of the two PAs. The signal separation may involve a complicated technique, and the signal summing with low loss and high isolation becomes difficult. The use of a digital signal processor (DSP) may allow for generation of improved S1 and S2 signals.

Envelope Elimination and Restoration (EER)

Figure 10:
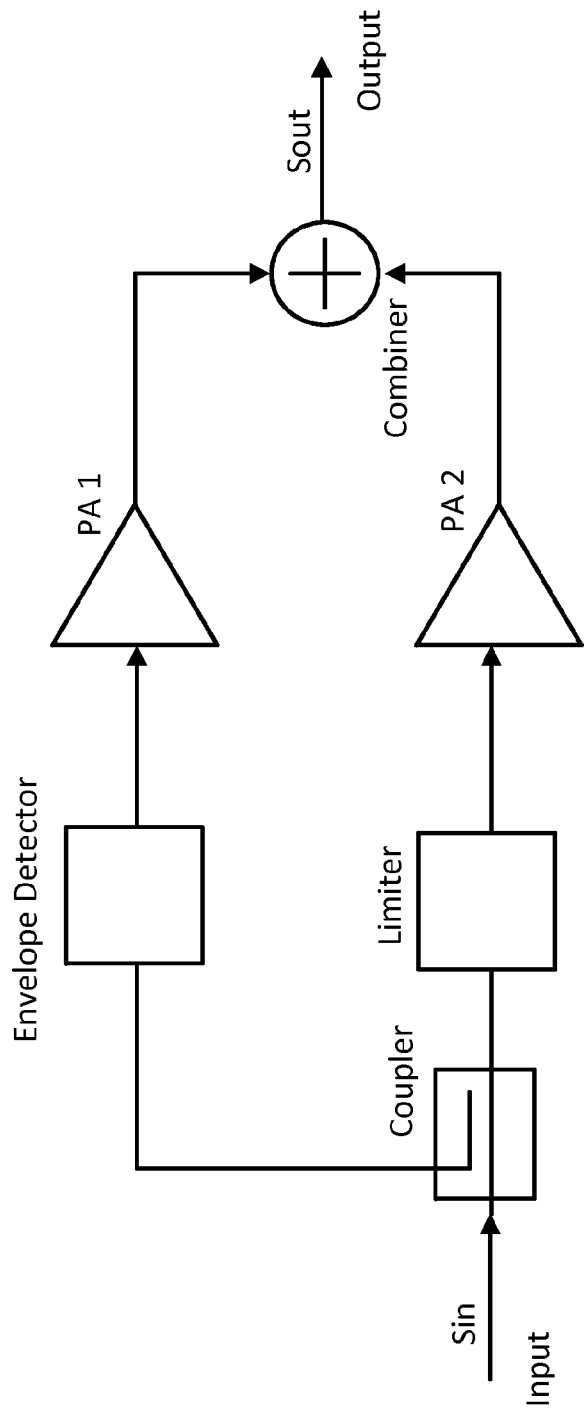
FIG. 10 illustrates an example of a system adapted for Envelope Elimination and Restoration (EER) technique.

FIG. 10 illustrates an example of a system adapted for EER technique. In this technique, the envelope of the input signal Sin is first eliminated by a limiter to generate a constant-amplitude phase signal. At the same time the magnitude information of the input signal Sin, sensed by a coupler, for example, is extracted by an envelope detector. The magnitude and phase information are amplified by PA1 and PA2, respectively, and then recombined by a combiner, for example, to generate the output signal S out.

In general, the envelope of the signal output of a switching mode PA is directly proportional to its supply voltage. The envelope and phase components can therefore be recombined if the phase signal is applied to the gate (or the base) of the transistor used in the PA, and the magnitude signal directly modulates the supply. Thus, non-linear but highly efficient PAs, such as class-D, -E or -F PAs, are used in the switching mode for the purpose of recombining the magnitude and phase components in this technique.

Envelope Tracking (ET)

Figure 11:
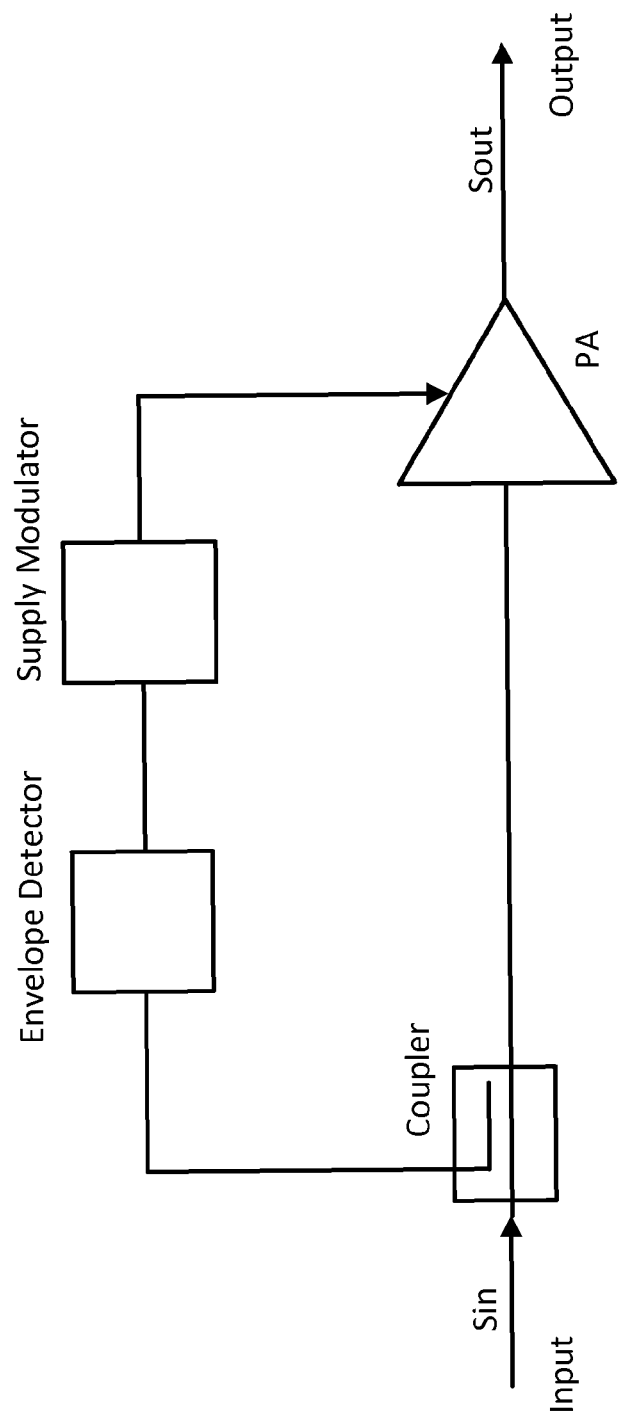
FIG. 11 illustrates an example of a system adapted for Envelope Tracking (ET) technique.

FIG. 11 illustrates an example of a system adapted for ET technique. An envelope detector obtains the instantaneous amplitude of the input signal Sin, sensed by a coupler, for example. A supply modulator converts the amplitude signal, outputted from the envelope detector, into a supply voltage for the PA. Therefore, the supply voltage applied to the PA is dynamically adjusted according to the amplitude information of the input signal Sin so that the PA operates close to saturation, thereby resulting in optimized efficiency. This technique can use linear PAs such as class-A, -AB or -J PAs.

Figure 12:
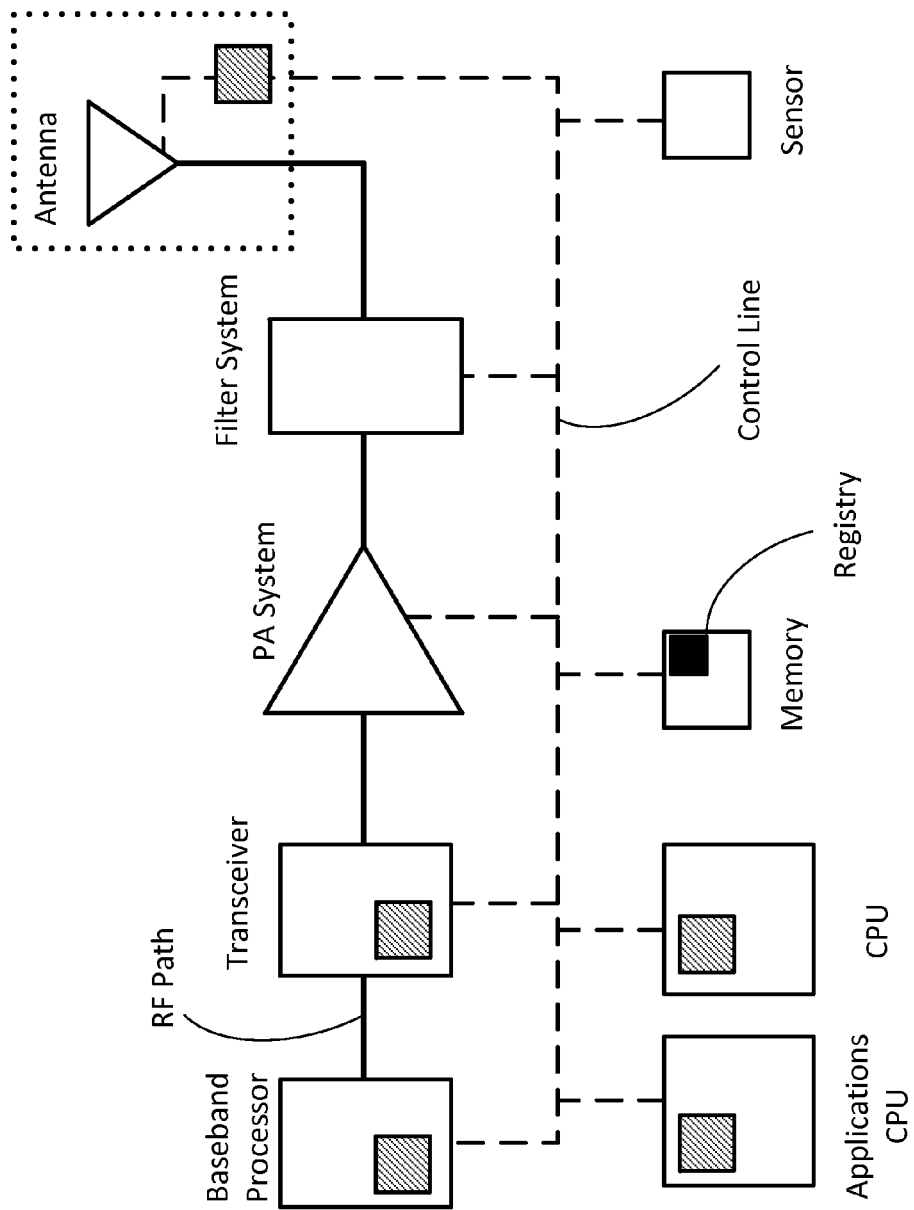
FIG. 12 illustrates an example of a communication system according to an embodiment.

The present document describes implementations of advanced communication systems including schemes to dynamically adjust one or more of frequency band, mode, impedance and other properties to achieve optimum performances, while maintaining good efficiency and linearity of the PA used therein. FIG. 12 illustrates an example of a communication system according to an embodiment. The system may include a baseband processor, a transceiver, a PA system, a filter system and an antenna, all coupled to an RF path. The baseband processor processes incoming signals and transmits RF signals to the RF path, and the transceiver further processes the RF signals through, for example, analog-to-digital conversion, digital-to-analog conversion, down conversion, up conversion and other processing means. The RF signals are inputted to the PA system, which includes a PA component and a linearization circuit to enhance the system linearity. Note that the linearization circuit can be configured to utilize any one of, a combination of, or a modification of the aforementioned linearization techniques to reduce signal distortions, thereby capable of linearizing signals for one or more of the PA component, the antenna and the filter system. The PA component can be a conventional PA or the multi-mode multi-band self-adjusting PA that can dynamically adjust its configuration to recover optimum performances under time-varying conditions. The RF signals are amplified and outputted from the PA system. The filter system is coupled to the PA system and includes filters and/or duplexers for signal filtering. The antenna receives the resultant RF signals and transmits corresponding radiations. Thus, the RF signals are monitored and linearized through the communication system.

RF modules such as the baseband processor, transceiver, PA system, filter system and the antenna are coupled to a controller through a control line, as indicated by dashed line in FIG. 12. In addition to these RF modules, the communication system may include an application CPU, a CPU, a memory, a sensor and other components. These components and the RF modules can be coupled through the control line, which may be configured to provide a bidirectional control. The bidirectional control can be realized, for example, by using an interface specified by the MIPI Alliance. See, for example, a white paper entitled "Tuning Technology: Key Element to Lower Operating Costs While Improving Wireless Network Performance," released on Feb. 8, 2011, by IWPC (International Wireless Industry Consortium). The bidirectional control line can be a conventional bus, wirelessly-connected transmission or other suitable forms. The application CPU and/or the CPU may be included in the baseband processor or located outside the baseband processor as illustrated in FIG. 12. The sensor section may include one or more sensors such as a proximity sensor, a motion sensor, a light sensor, a pressure sensor or other types of sensors, to detect the environment and send the detected information to the controller. The controller is configured to include an algorithm to control the RF modules and other components in the system for the self-adjustment. The communication system is further configured to include a registry tabulating predetermined parameters as nominal references, and the algorithm is configured to optimize the system performance with respect to the nominal references depending on time-varying conditions, for example, an environment perturbed due to the placement of a head, a hand, or other interference-causing objects nearby. The entries in the registry can be updated as needed, and the registry may be stored in a memory. The controller can be located in the baseband, the transceiver, the application CPU, the CPU, or associated with the antenna as indicated by hashed box in FIG. 12 as possible locations. In the case of having the controller with the antenna, the new module including the antenna, the controller and other peripherals can be configured to be self-sufficient as a compact antenna system, as indicated by dotted box in FIG. 12, which can be used as an integrated "plug-and-play" module. Thus, the present communication system as illustrated in FIG. 12 is configured to monitor the RF signals at each of the RF modules, which are tuned or optimized dependently or independently of each other.

FIG. 13 illustrates an example of the PA system using an implementation of a DPD linearization technique. The PA system may include the multi-mode multi-band self-adjusting PA that can dynamically adjust its configuration to recover optimum performances, and a DPD linearization circuit around it to achieve high linearity. As mentioned earlier, linearization provides less back-off, thereby improving efficiency. Alternatively, the PA component in the PA system can be a conventional PA. The RF signals are inputted from a PA system input coupled to the RF path in the communication system, amplified and linearized in the PA system, and outputted from a PA system output coupled to the RF path in the communication system. The multi-mode multi-band self-adjusting PA or the conventional PA component is controlled by the controller through the control line. Other active and/or tunable elements, such as the adaptation module, the delay block, and the modulators, may also be controlled by the controller in this scheme. As a design option, the look-up table in the DPD circuit may be included in the registry to tabulate the pre-distortion functions along with the predetermined parameters.

Although only the example using the DPD linearization technique for the PA is described above, any one of, a combination of, or a modification of the aforementioned linearization techniques can be adapted for signal linearization of one or more of the PA, the filter and the antenna. Such a system is configured to incorporate the chosen linearization scheme with the multi-mode multi-band self-adjusting functions or the single-mode single-band functions.

Figure 13A:
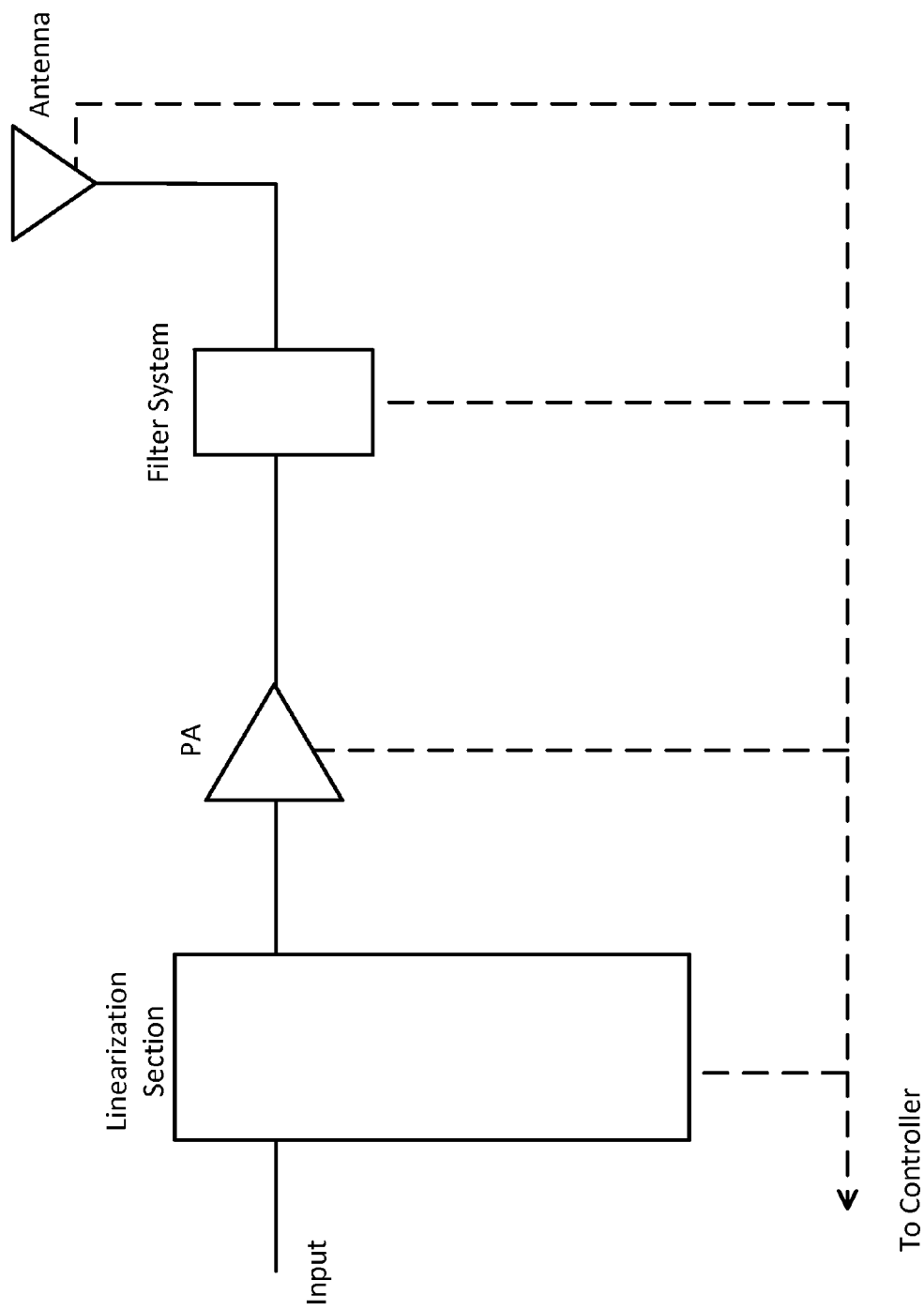
FIG. 13A illustrates a variation example of linearization implementation.

FIG. 13A illustrates a variation example of linearization implementation. The linearization circuit is split into an output section and a linearization section in this implementation. The output section is a section configured to be on the output side of the PA and may include a sensing element such as a coupler in the DPD or the feedback linearization technique. The output section generally includes a simple element that can be integrated with the PA, the filter system or the antenna. The PA can be a multi-mode multi-band self-adjusting PA or a conventional PA. The linearization section constitutes a main block of a linearization circuit based on one of, a combination of, or a modification of the aforementioned linearization techniques. The linearization section can be included in a transceiver or a baseband processor, or separated from the other RF modules. Alternatively, the linearization section, the PA and the output section can be grouped to form a PA system as illustrated in FIG. 12. The amplified signal is sent through the filter system to the antenna. The linearization section, the PA, the filter system and the antenna are coupled to a controller through a control line. As in FIG. 12, the controller can be located in an application CPU, a CPU, a baseband, a transceiver or associated with the antenna. The CPU and/or the application CPU may be included in the baseband.

The registry may include specifications of a PA such as Pout, PAE, ACPR, EVM and other PA parameters. As mentioned earlier, Pout is a measure of the PA output power, PAE is a measure of the PA efficiency, and ACPR and EVM are measures of the PA linearity. The registry may also include specifications of an antenna, such as antenna efficiency and Total Radiated Power (TRP) that is a measure of the antenna output power. S parameters such as S12 and S11 may also be included. In addition to industry standards of the specifications, these parameters may be measured beforehand for various use conditions, e.g., in free space, in the presence of a head, a hand, laps, wood, metal, different positions, in a long or short distance to a base station, etc. Here, the information on the distance between a base station and the communication system can be obtained through the Transmitted Power Control (TPC) parameter transmitted from the base station. For example, when the system is close to or far away from the base station, the respective TPC values can so indicate. The measured parameters under various conditions are stored in the registry to adjust bands, modes, impedances and other properties. These registry entries may be updated as needed so that the algorithm can converge faster to the optimum operation.

FIG. 13B illustrates an example of the registry entries. The state 1 indicates the mode and band selection of GSM(880-960 MHz) under the condition of having a head in the proximity of the antenna; and the state 2 indicates the mode and band selection of PCS(1930-1990 MHz) under the condition of having a hand in the proximity of the antenna. The specification parameters such as Pout, PAE, ACPR, EVM, etc. can be measured beforehand and stored in the registry. Base on the parameter values, the adjustment for the optimum performance is made in terms of the selection of matching modules in the PA for impedance, the number of banks of transistors to be ON for frequency band, the selection of the antenna switch position for impedance matching, and various other adjustable configurations. These measured parameters and the adjustment are categorized according to different states, each corresponding to a band and mode selection of the signal under a certain condition.

The controller in the communication system is configured to receive information on the signals and conditions and to control one or more of the RF modules to adjust the properties to achieve optimum performances corresponding to the mode and the band selected as well as to the condition imposed during a time interval. Further, the controller controls the RF modules variably with time as the information varies to meet specifications associated with the signals and the condition during each time interval. For example, the information may include a different selection of the mode and the band of the signals when the user enters a foreign country. Accordingly, the controller controls the RF modules to meet the specifications associated with the signals in the mode and in the band. In particular, the PA system can be adjusted to have adequate DC biases, an adequate series of banks and matching modules for the mode and the band. In case the PA system includes a conventional PA component, the DC bias can be adjusted for optimization. Furthermore, when the antenna gets detuned by perturbations such as the presence of a head, a hand or other interference-causing objects, the controller obtains information on the perturbed output signals from the antenna and/or the sensor. The controller then controls one or more of the PA system, the filter system and other RF modules to readjust the affected properties such as frequency and impedance to optimize the performance under the condition by looking up the relevant entries in the registry. Additionally or alternatively, if the antenna is configured to be tunable, the controller can tune the antenna to adjust the affected parameters such as frequency and impedance. For example, the change in impedance may be sensed by the antenna, and the information is sent to the controller via the control line. The controller then adjusts the matching modules in the PA system and/or tunes the tunable antenna to recover the optimum impedance. In another example, the change in frequency of the output signal may be sensed by the antenna, and the information is sent to the controller. The controller then adjusts the matching modules in the PA system to recover the frequency band and also controls the input terminals of the banks to turn on an adequate series of banks to recover the power amplifying level for the frequency band. Perturbations to nominal conditions include a distance to a base station, which may be indicated by the TPC parameter mentioned above. For example, when the system is close to the base station, the TPC may so indicate. In this case, the output power does not have to be high, and thus the PA system does not have to amplify the power level significantly. Based on the Pout information corresponding to the TPC parameter, the controller controls the input terminals of the banks in the PA system to turn on less number of banks in the series than when the system is in a long distance from the base station, thereby outputting less output power.

Figure 14:
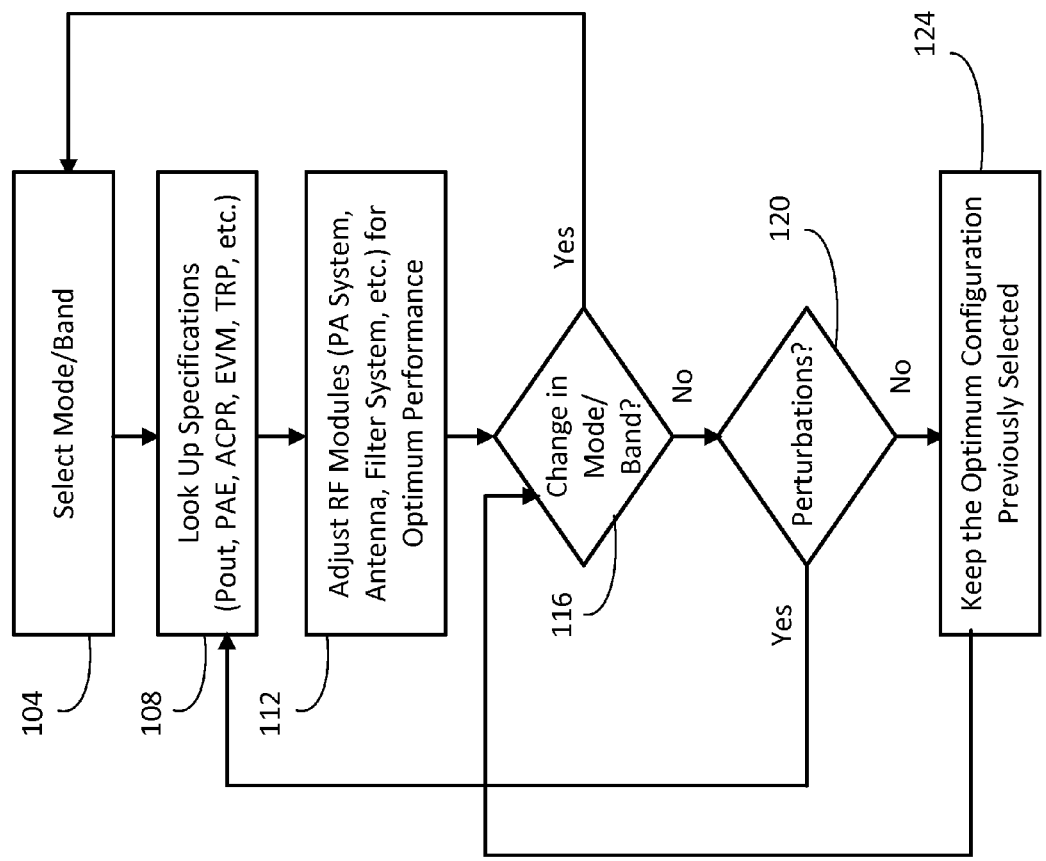
FIG. 14 illustrates a process flow executed by the algorithm to operate the communication system as illustrated in FIG. 12.

FIG. 14 illustrates a process flow executed by the algorithm to operate the communication system as illustrated in FIGS. 12 and 13A. In the first step 104, the algorithm selects the combination of a frequency band and a mode depending on information from, e.g., a user selection, a base station, or other commanding locations or systems. In the next step 108, the algorithm obtains specifications for the selected band and mode in terms of output power, efficiency, and linearity and other properties. These specifications can be tabulated in terms of Pout, PAE, ACPR, EVM, TRP, etc. in the registry, which may be loaded onto the memory beforehand. Assuming certain nominal conditions, such as loads and a distance to the base station, in the next step 112, the algorithm adjusts one or more of the RF modules to provide the optimum configuration to achieve optimum performances. For example, the algorithm may control the PA system to select an adequate series of banks in the amplifying modules and adjust the matching modules, or the algorithm may tune the antenna to recover adequate frequencies and impedances. In the next step 116, the algorithm checks if a different combination of a mode and a band is specified, for example, by a user entering a foreign country that uses a different protocol for wireless communication. If "Yes," the algorithm goes back to the initial step 104 to select the new mode and the new band, and follows the same process. If "No," the algorithm still keeps the optimum configuration for the originally selected mode and band, but the algorithm checks, in the step 120, if there are any perturbations caused by changes in conditions, such as a change in distance to the base station, frequency shift and/or impedance change caused by the presence of an interference-causing object in the proximity of the antenna, and so on. If "Yes," the algorithm goes back to the step 108 to look up specifications under the new condition, followed by the step 112 to seek for a new optimum configuration by adjusting one or more of the PA system, the antenna, the filter system and other RF modules. If there is no perturbation, the system keeps the optimum configuration previously selected as in the step 124, but keeps monitoring in the step 120 if there are any perturbations or changes in selection of a mode and a band.

Figure 15:
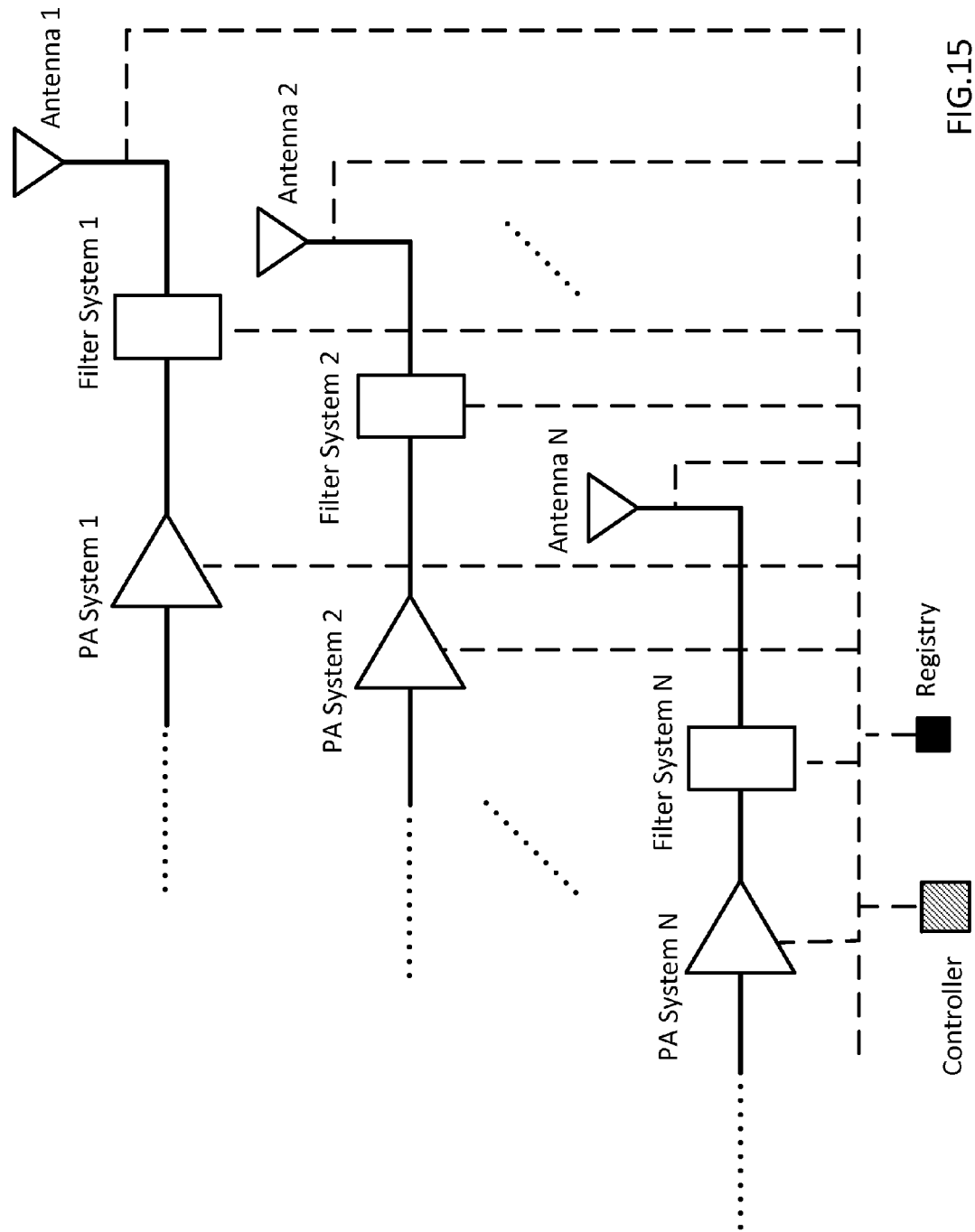
FIG. 15 illustrates an example of a communication system having multiple RF paths, each coupled to RF modules such as an antenna, a PA system, a filter system and others.

FIG. 15 illustrates an example of a communication system having multiple RF paths, each coupled to RF modules such as an antenna, a PA system, a filter system and others. The first RF path is coupled to an antenna 1, a filter system 1 and a PA system 1; the second RF path is coupled to an antenna 2, a filter system 2 and a PA system 2; . . . ; and the Nth RF path is coupled to an antenna N, a filter system N and a PA system 2. Other RF modules and peripherals are omitted for simplicity. A controller is coupled to each of the RF modules through a control line, and a registry is coupled to the control line enabling the algorithm in the controller to look up.

For the case of having multiple antennas as in the example of FIG. 15, certain changes in the conditions affecting one of the multiple antennas may also have effects on the other antennas due to interactions among the antennas. Because of the limited space in a handset, for example, coupling between antennas is likely to occur; therefore, it is necessary to tune all the paths as a full system. For example, detuning caused by a head, a hand or other interference-causing objects placed in the proximity of one antenna can affect the other antennas as well. In such a complex case, the controller controls each of the RF modules iteratively to meet the specifications for the selected mode and band under the condition during the time period. In this case, the controller controls the RF modules in each path to follow the process illustrated in FIG. 14 iteratively until the properties of signals outputting from each antenna meet the specifications as a full system.

Figure 16:
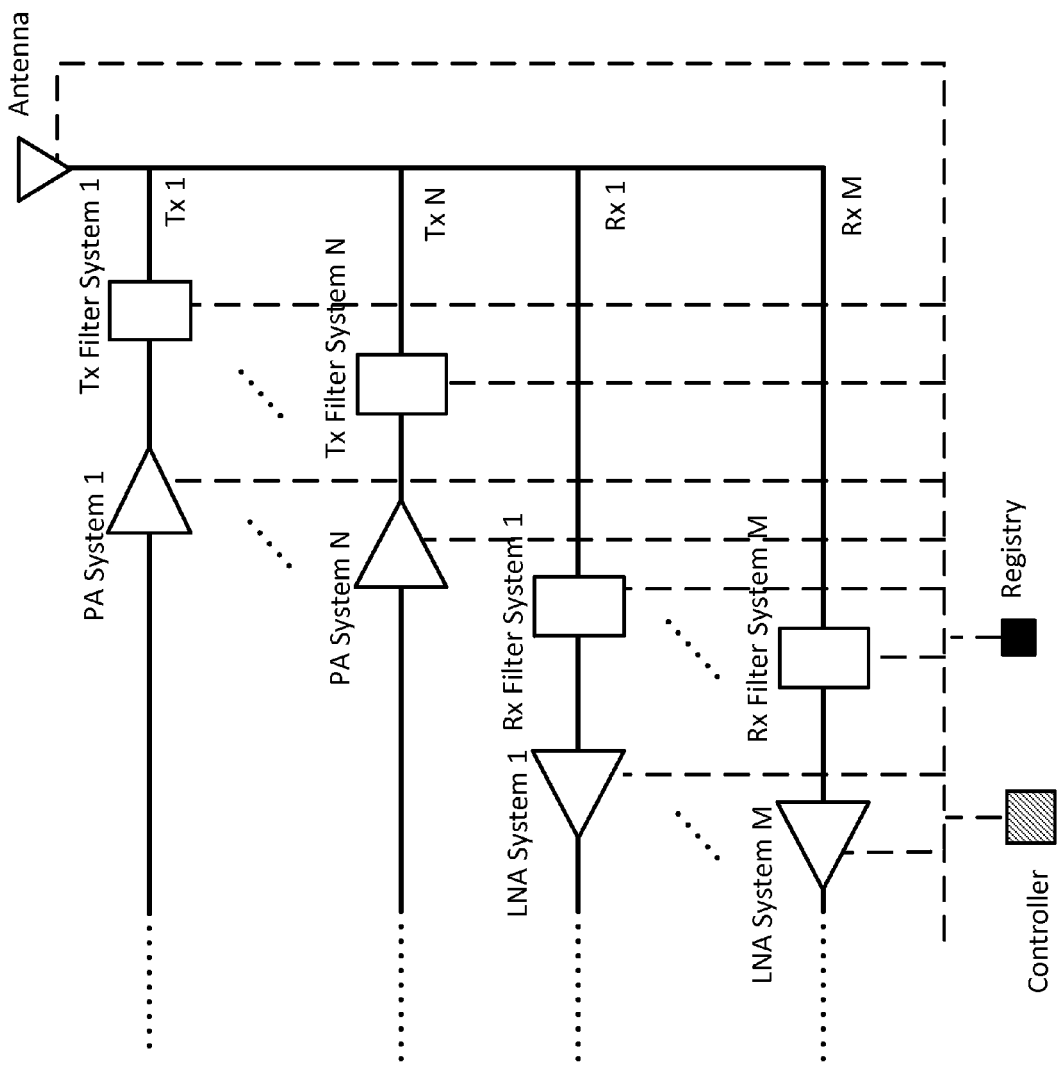
FIG. 16 illustrates an example of a communication system having a single antenna with multiple feeds, each feed coupled to an RF path.

FIG. 16 illustrates an example of a communication system having a single antenna with multiple feeds, each feed coupled to an RF path. Some of the RF paths are configured for transmit (Tx) functions, labeled Tx 1, . . . and Tx N; and the other RF paths are configured for receive (Rx) functions, labeled Rx 1, . . . an Rx M. Each of the Tx paths has a PA system, a Tx filter system and other modules; and each of the RX paths has a low noise amplifier (LNA) system, an Rx filter system and other modules. An LNA component or at least part of the LNA system may be included in a transceiver. A controller is coupled to the antenna and each of the PA systems, LNA systems, Tx filter systems and Rx filter systems, and may also be coupled to other RF modules and peripheral components through a control line. A registry is coupled to the control line enabling the algorithm in the controller to look up. As in the previous examples, the controller can be located in a baseband processor, a transceiver, an application CPU, a CPU or associated with the antenna. The application CPU and/or the CPU can be included in the baseband processor. In the case of having the controller with the antenna, the new module including the antenna, the controller and other peripherals can be configured to be self-sufficient as a compact antenna system, which can be used as an independent "plug-and-play" module.

The multi-feed antenna in the above example may be configured based on the implementations described in the U.S. patent application Ser. No. 13/608,883, entitled "COMMUNICATION SYSTEMS WITH ENHANCED ISOLATION PROVISION AND OPTIMIZED IMPEDANCE MATCHING," filed on Sep. 10, 2012; the contents of the which are incorporated herein by reference. The multi-feed antenna includes multiple feeds coupled to the multiple paths, respectively, to provide physical separation of the multiple paths from each other. The antenna is configured to provide impedance matching for each of the multiple paths. The physical separations among the multiple paths and the impedance matching for each of the multiple paths provide isolation among the multiple paths and relax rejection considerations on the filters. The controller can control the antenna to adjust the frequency band, mode, linearity, impedance and other properties based on the information about the signals and conditions.

In the above examples of FIGS. 15 and 16, the PA system including the PA component and the linearization circuit can be regrouped to have a implementation variation as illustrated in FIG. 13A. Namely, the linearization circuit may be split into an output section and a linearization section. The output section is a section configured to be on the output side of the PA and may include a sensing element such as a coupler in the DPD or the feedback linearization technique. The output section generally includes a simple element that can be integrated with the PA, the filter system or the antenna. The PA can be a multi-mode multi-band self-adjusting PA or a conventional PA. The linearization section constitutes a main block of a linearization circuit based on one of, a combination of, or a modification of the aforementioned linearization techniques. The linearization section can be included in a transceiver or a baseband processor, or associated with the PA component, or separated from the other RF modules.

While this document contains many specifics, these should not be construed as limitations on the scope of an invention or of what may be claimed, but rather as descriptions of features specific to particular embodiments of the invention. Certain features that are described in this document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be exercised from the combination, and the claimed combination may be directed to a subcombination or a variation of a subcombination.

What is claimed is:

1. A communication system comprising:
   an antenna for transmitting signals;
   a PA component for amplifying the signals;
   a linearization circuit to enhance linearity of the signals;
   a filter system for filtering the signals; and
   a controller coupled to the PA component, the linearization circuit, the filter system and the antenna,
   wherein
   the controller receives information on the signals and conditions, and based on the information the controller controls one or more of the antenna, the PA component, the linearization circuit and the filter system to provide an optimum configuration to meet specifications of signal properties under the condition.

2. The communication system of claim 1, wherein the PA component is a conventional PA or a multi-mode multi-band self-adjusting PA configured to operate for the signals in a plurality of modes and a plurality of frequency bands and to adjust its configuration according to control signals.

3. The communication system of claim 2, wherein the multi-mode multi-band self-adjusting PA comprises:
   one or more amplifying modules, each amplifying module including one or more banks, each bank including one or more transistors; and
   a plurality of matching modules for adjusting impedances and coupled to the one or more amplifying modules,
   wherein
   the controller controls the one or more amplifying modules and the plurality of matching modules to obtain the optimum configuration.

4. The communication system of claim 1, further comprising
   a registry having entries regarding the specifications of signal properties under conditions in terms of predetermined parameters, wherein the controller looks up the specifications corresponding to the information to control one or more of the antenna, the PA, the linearization circuit and the filter system.

5. The communication system of claim 4, wherein the specifications of signal properties include at least part of output power, efficiency and linearity.

6. The communication system of claim 4, wherein the predetermined parameters are based on at least part of industry standards and measurements.

7. The communication system of claim 1, wherein the linearization circuit is configured to be included in a baseband processor or a transceiver, or associated with the PA component.

8. The communication system of claim 1, wherein the linearization circuit is configured to operate based on one of, a combination of, or a modification of analog pre-distortion technique, digital pre-distortion (DPD) technique, feedforward linearization technique, envelope feedback linearization technique, polar feedback linearization technique, Cartesian feedback linearization technique, Linear Amplification Using Non-linear Components (LINC) technique, Envelope Elimination and Restoration (EER) technique, or Envelope Tracking (ET) technique.

9. A communication system comprising a plurality of RF paths, wherein
   each RF path comprises:
      an antenna for transmitting signals;
      a PA system comprising
         a PA component, and
         a linearization circuit to enhance linearity; and
      a filter system for filtering the signals,
   and wherein
   the communication system further comprises a controller coupled to the antenna, the PA system and the filter system in each RF path, receives information on the signals and conditions, and controls one or more of the antennas, the PA systems and the filter systems based on the information to provide an optimum configuration to meet specifications of signal properties under the conditions.

10. The communication system of claim 9, wherein the information includes changes in conditions affecting one of the plurality of antennas and effects on the other antennas caused by interactions among the antennas, and based on the information the controller controls one or more of the antennas, the PA systems and the filter systems interactively to provide the optimum configuration.

* * * * *